US008785235B2

(12) United States Patent
Teng et al.

(10) Patent No.: US 8,785,235 B2
(45) Date of Patent: Jul. 22, 2014

(54) APPARATUS AND METHOD FOR PRODUCING SOLAR CELLS

(75) Inventors: Edward Teng, Sunnyvale, CA (US);
Ying-Chen Chao, Hsinchu (TW);
Chih-Jen Yang, Taichung (TW);
Kuo-Jui Hsiao, Taichung (TW)

(73) Assignee: TSMC Solar Ltd., Taichung (TW)

( * ) Notice: Subject to any disclaimer, the term of this patent is extended or adjusted under 35 U.S.C. 154(b) by 222 days.

(21) Appl. No.: 13/486,079

(22) Filed: Jun. 1, 2012

(65) Prior Publication Data

US 2013/0210190 A1    Aug. 15, 2013

Related U.S. Application Data

(60) Provisional application No. 61/597,608, filed on Feb. 10, 2012.

(51) Int. Cl.
*H01L 21/00* (2006.01)
*H01L 31/0264* (2006.01)
*H01L 21/02* (2006.01)
*H01L 21/28* (2006.01)

(52) U.S. Cl.
CPC ..... *H01L 21/02631* (2013.01); *H01L 21/28194* (2013.01)
USPC ..................... 438/95; 257/E31.004

(58) Field of Classification Search
CPC ................... H01L 21/02631; H01L 21/28194
USPC ..................... 438/95; 257/E31.004
See application file for complete search history.

(56) References Cited

U.S. PATENT DOCUMENTS

| 4,675,096 A | * | 6/1987 | Tateishi et al. ............ 204/298.25 |
| 5,439,575 A | | 8/1995 | Thornton et al. |
| 6,310,281 B1 | | 10/2001 | Wendt et al. |
| 6,974,976 B2 | * | 12/2005 | Hollars .......................... 257/184 |
| 2011/0030794 A1 | * | 2/2011 | Teng ............................ 136/262 |

OTHER PUBLICATIONS

Nakada, T. et al, "Growth of CuInSe2 Films for Solar Cells by Using a Multi-Source Sputtering Apparatus", Technical Digest of the International PVSEC-3, Tokyo, Japan, 1987, P-II-10, pp. 553-556.
Nakada, T. et al, "Microstructural Characterization for Sputter-Deposited CuInSe2 Films and Photovoltaic Devices", Jpn. J. Appl. Phys., Part 1, No. 9A, Sep. 1995, 34:4715-4721.
Nakada, T. et al, "Sequential Sputtering/Selenization Technique for the Growth of CuInSe2 Thin Films", Jpn. J. Appl. Phys., Part 2, No. 9A/B, Sep. 1998, 37:L1065-L1067.

* cited by examiner

*Primary Examiner* — Luan C Thai
(74) *Attorney, Agent, or Firm* — Duane Morris LLP

(57) ABSTRACT

A method and apparatus for forming a solar cell. The apparatus includes a housing defining a vacuum chamber and a rotatable substrate apparatus configured to hold a plurality of substrates on a plurality of surfaces wherein each of the plurality of surfaces are disposed facing an interior surface of the vacuum chamber. A first sputtering source is configured to deposit a plurality of absorber layer atoms of a first type over at least a portion of a surface of each one of the plurality of substrates. An evaporation source is disposed in a first subchamber of the vacuum chamber and configured to deposit a plurality of absorber layer atoms of a second type over at least a portion of the surface of each one of the plurality of substrates. A first isolation source is configured to isolate the evaporation source from the first sputtering source.

20 Claims, 13 Drawing Sheets

US 8,785,235 B2

APPARATUS AND METHOD FOR PRODUCING SOLAR CELLS

CROSS-REFERENCE TO RELATED APPLICATIONS

This application claims priority to, and hereby incorporates by reference in its entirety, U.S. Provisional Patent Application Ser. No. 61/597,608 filed on Feb. 10, 2012.

FIELD

The present disclosure relates generally to the field of photovoltaics, and more specifically to an apparatus and method for producing solar cells.

BACKGROUND

Copper indium gallium diselenide (CIGS) is a commonly used absorber layer in thin film solar cells. CIGS thin film solar cells have achieved excellent conversion efficiency (>20%) in laboratory environments. Most conventional CIGS deposition is done by one of two techniques: co-evaporation or selenization. Co-evaporation involves simultaneously evaporating copper, indium, gallium and selenium. The different melting points of the four elements makes controlling the formation of a stoichiometric compound on a large substrate very difficult. Additionally, film adhesion is very poor when using co-evaporation. Selenization involves a two-step process. First, a copper, gallium, and indium precursor is sputtered on to a substrate. Second, selenization occurs by reacting the precursor with toxic H2Se/H2S at 500° Celsius or above.

BRIEF DESCRIPTION OF THE DRAWINGS

Various aspects of the present disclosure will be or become apparent to one with skill in the art by reference to the following detailed description when considered in connection with the accompanying exemplary non-limiting embodiments.

DETAILED DESCRIPTION OF THE EXAMPLES

Figure 1:
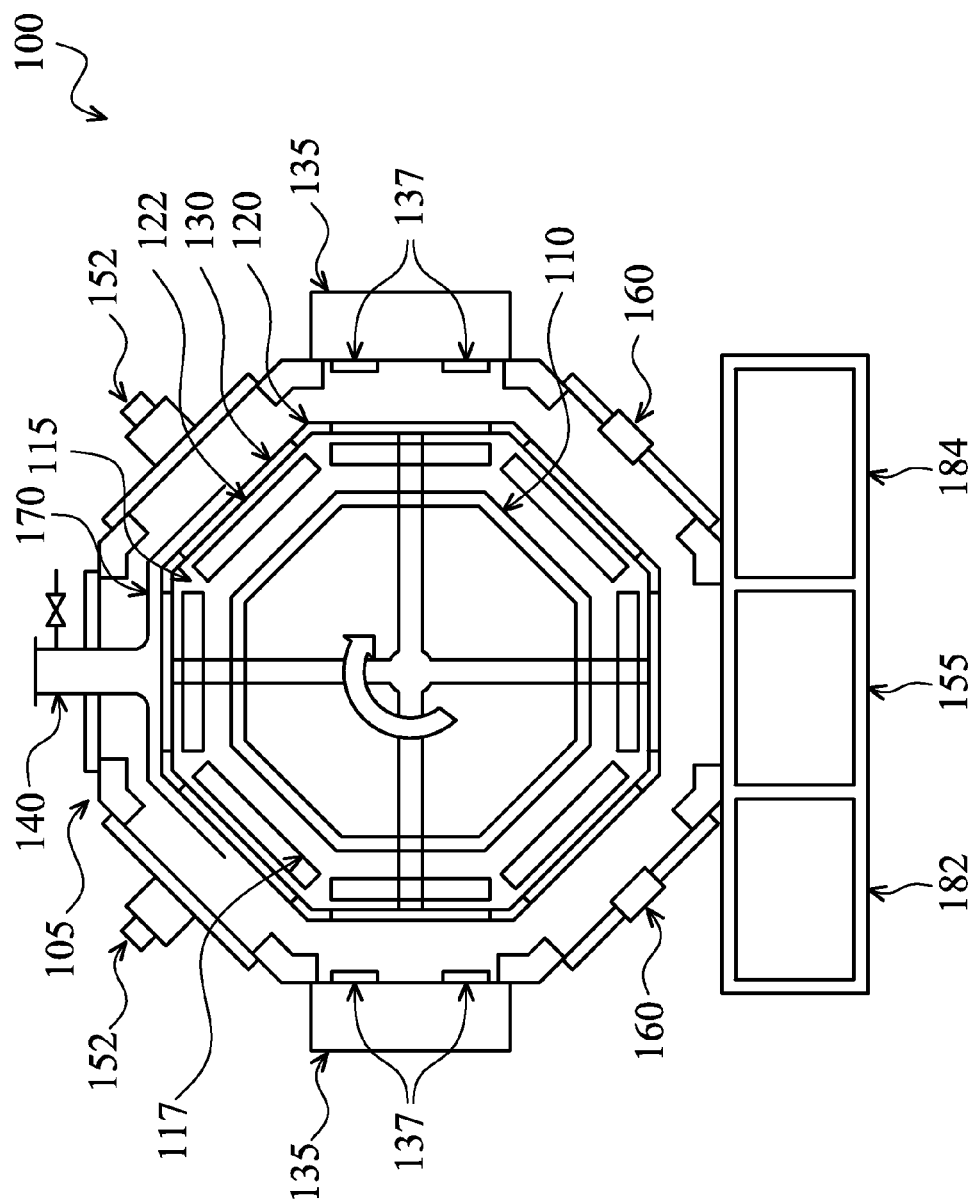
FIG. 1 is a schematic diagram illustrating a top view of an example of a solar cell forming apparatus according to embodiments of the present disclosure.

With reference to the Figures, where like elements have been given like numerical designations to facilitate an understanding of the drawings, the various embodiments of a multigate semiconductor device and methods of forming the same are described. The figures are not drawn to scale.

The following description is provided as an enabling teaching of a representative set of examples. Many changes can be made to the embodiments described herein while still obtaining beneficial results. Some of the desired benefits discussed below can be obtained by selecting some of the features or steps discussed herein without utilizing other features or steps. Accordingly, many modifications and adaptations, as well as subsets of the features and steps described herein are possible and may even be desirable in certain circumstances. Thus, the following description is provided as illustrative and is not limiting.

This description of illustrative embodiments is intended to be read in connection with the accompanying drawings, which are to be considered part of the entire written description. In the description of embodiments disclosed herein, any reference to direction or orientation is merely intended for convenience of description and is not intended in any way to limit the scope of the present disclosure. Relative terms such as "lower," "upper," "horizontal," "vertical,", "above," "below," "up," "down," "top" and "bottom" as well as derivative thereof (e.g., "horizontally," "downwardly," "upwardly," etc.) should be construed to refer to the orientation as then described or as shown in the drawing under discussion. These relative terms are for convenience of description only and do not require that the apparatus be constructed or operated in a particular orientation. Terms such as "attached," "affixed," "connected" and "interconnected," refer to a relationship wherein structures are secured or attached to one another either directly or indirectly through intervening structures, as well as both movable or rigid attachments or relationships, unless expressly described otherwise. The term "adjacent" as used herein to describe the relationship between structures/components includes both direct contact between the respective structures/components referenced and the presence of other intervening structures/components between respective structures/components.

As used herein, use of a singular article such as "a," "an" and "the" is not intended to exclude pluralities of the article's object unless the context clearly and unambiguously dictates otherwise.

Improved apparatus and processes for manufacturing thin film solar cells are provided. The inventors have observed that by combining evaporation and sputtering processes into an apparatus and/or method of manufacturing thin film solar cells, an improved mixing of absorber layer atoms may be obtained with an easily scalable volume production. The inventors have determined that including an isolation source in the apparatus, and using an isolation source in performing the method, can isolate and separate evaporation and sputtering processes, minimize sputtering source contamination and provide a safer and more efficient process for manufacturing thin film solar cells.

FIG. 1 is a schematic diagram illustrating a top view of an example of a solar cell forming apparatus 100 according to embodiments of the present disclosure. As shown, a solar cell forming apparatus 100 includes a housing 105 defining a vacuum chamber. In various embodiments, the housing 105 may be shaped as a polygon. For example, as shown in the illustrated embodiment, the housing 105 may be octagonally shaped. In various embodiments, the housing 105 has one or more removable doors built on one or more sides of the vacuum chamber. The housing 105 may be composed of stainless steel or other metals and alloys used for drum coater housings. For example, the housing 105 can define a single vacuum chamber having a height of approximately 2.4 m (2.3 m to 2.5 m) with a length and width of approximately 9.8 m (9.7 m to 9.9 m).

In some embodiments, the solar cell forming apparatus 100 includes a rotatable substrate apparatus 120 configured to hold a plurality of substrates 130 on a plurality of surfaces 122 where each of the plurality of surfaces 122 are disposed facing an interior surface of the vacuum chamber. In some embodiments, each one of the plurality of substrates 130 include a suitable material such as, for example, glass. In other embodiments, one or more of the plurality of substrates 130 include a flexible material. In some embodiments, the flexible material includes stainless steel. In other embodiments, the flexible material includes plastic. In various embodiments, the rotatable substrate apparatus 120 is shaped as a polygon. For example, in the illustrated embodiment, a plurality of substrates 130 are held on a plurality of surfaces 122 in a substantially octagonal shaped rotatable substrate apparatus 120. In other embodiments, for example, the substrate apparatus 120 may be rectangular shaped. Any suitable shape can be used for the rotatable substrate apparatus 120.

As shown in FIG. 1, the substrate apparatus 120 is rotatable about an axis in the vacuum chamber. FIG. 1 illustrates a clockwise direction of rotation for the rotatable substrate apparatus 120. In some embodiments, substrate apparatus 120 is configured to rotate in a counter-clockwise direction. In various embodiments, the rotatable substrate apparatus 120 is operatively coupled to a drive shaft, a motor, or other mechanism that actuates rotation from a surface of the vacuum chamber. In some embodiments, substrate apparatus 120 is rotated at a speed, for example, between approximately 5 and 100 RPM (e.g. 3 and 105 RPM). In various embodiments, a speed of rotation of the rotatable substrate apparatus 120 is selected to minimize excessive deposition of absorption components on the plurality of substrates 130. In some embodiments, the substrate apparatus rotates at a speed of approximately 80 RPM (e.g. 75-85 RPM). In some embodiments, the apparatus 100 includes a rotatable drum 110 disposed within the vacuum chamber and coupled to a first surface of the vacuum chamber. As illustrated in FIG. 1, the rotatable drum 110 can be disposed within the vacuum chamber. In the illustrated embodiment, the rotatable drum 110 is operatively coupled to the substrate apparatus 120. As shown, the rotatable drum 110 has a shape that is substantially conformal with the shape of the substrate apparatus 120. However, the rotatable drum can have any suitable shape.

In various embodiments, the apparatus 100 includes a first sputtering source 135 configured to deposit a plurality of absorber layer atoms of a first type over at least a portion of a surface of each one of the plurality of substrates 130. As shown in the illustrated embodiment, the first sputtering source 135 can be disposed within a vacuum chamber between the substrate apparatus 120 and the housing. The first sputtering source 135 can be coupled to a surface of the vacuum chamber. The first sputtering source 135 can be, for example, a magnetron, an ion beam source, a RF generator, or any suitable sputtering source configured to deposit a plurality of absorber layer atoms of a first type over at least a portion of a surface of each one of the plurality of substrates 130. In some embodiments, the first sputtering source 135 includes at least one of a plurality of sputtering targets 137. The first sputtering source 135 can utilize a sputtering gas. In some embodiments, sputtering is performed with an argon gas. Other possible sputtering gases include krypton, xenon, neon, and similarly inert gases.

As shown in FIG. 1, apparatus 100 can include a first sputtering source 135 disposed within the vacuum chamber and configured to deposit a plurality of absorber layer atoms of a first type over at least a portion of a surface of each one of the plurality of substrates 130 and a second sputtering source 135 disposed within the vacuum chamber and opposite the first sputtering source and configured to deposit a plurality of absorber layer atoms of a second type over at least a portion of a surface of each one of the plurality of substrates 130. In other embodiments, the first sputtering source 135 and the second sputtering source 135 are disposed adjacent to each other within the vacuum chamber. In some embodiments, the first and second sputtering sources 135 can each include at least one of a plurality of sputtering targets 137.

In various embodiments, a first sputtering source 135 is configured to deposit a plurality of absorber layer atoms of a first type (e.g. copper (Cu)) over at least a portion of a surface of each one of the plurality of substrates 130 and a second sputtering source 135 is configured to deposit absorber layer atoms of a second type (e.g. indium (In)) over at least a portion of a surface of each one of the plurality of substrates 130. In some embodiments, the first sputtering source 135 is configured to deposit a plurality of absorber layer atoms of a first type (e.g. copper (Cu)) and a third type (e.g. gallium (Ga)) over at least a portion of a surface of each one of the plurality of substrates 130. In some embodiments, a first sputtering source 135 includes one or more copper-gallium sputtering targets 137 and a second sputtering source 135 includes one or more indium sputtering targets 137. For example, a first sputtering source 135 can include two copper-gallium sputtering targets and a second sputtering source 135 can include two indium sputtering targets. In some embodiments, a copper-gallium sputtering target 137 includes a material of approximately 70 to 80% (e.g. 69.5 to 80.5%) copper and approximately 20 to 30% (e.g. 19.5 to 30.5%) gallium. In various embodiments, the solar cell forming apparatus 100 has a first copper—gallium sputtering target 137 at a first copper: gallium concentration and a second copper—gallium sputtering target 137 at a second copper: gallium concentration for grade composition sputtering. For example, a first copper-gallium sputtering target can include a material of 65% copper and 35% gallium to control monolayer deposition to a first gradient gallium concentration and a second copper-gallium sputtering target can include a material of 85% copper and 15% gallium to control monolayer deposition to a second gradient gallium concentration. The plurality of sputtering targets 137 can be any suitable size. For example, the plurality of sputtering targets 137 can be approximately 15 cm wide (e.g. 14-16 cm) and approximately 1.9 m tall (e.g. 1-8-2.0 m).

In some embodiments, a sputtering source 135 that is configured to deposit a plurality of absorber layer atoms of indium over at least a portion of the surface of each one of the plurality of substrates 130 can be doped with sodium (Na). For example, an indium sputtering target 137 of a sputtering source 135 can be doped with sodium (Na) elements. The inventors have determined that doping an indium sputtering target 137 with sodium may minimize the need for depositing an alkali-silicate layer in the solar cell. This improvement may result in lower manufacturing costs for the solar cell as sodium is directly introduced to the absorber layer. In some embodiments, a sputtering source 135 is a sodium-doped copper source having between approximately two and ten percent sodium (e.g. 1.95 to 10.1 percent sodium). In various embodiments, an indium sputtering source 135 can be doped with other alkali elements such as, for example, potassium. In other embodiments, apparatus 100 can include multiple copper-gallium sputtering sources 135 and multiple sodium doped indium sputtering sources 135. For example, the solar cell forming apparatus can have a 65:35 copper-gallium sputtering source 135 and an 85:15 copper-gallium sputtering source 135 for grade composition sputtering.

In various embodiments, apparatus 100 includes an evaporation source 140 configured to deposit a plurality of absorber layer atoms of a fourth type over at least a portion of the surface of each one of the plurality of substrates 130. In various embodiments, the fourth type is non-toxic elemental selenium. The fourth type can include any suitable evaporation source material. In some embodiments, evaporation source 140 is configured to produce a vapor of an evaporation source material of the fourth type. In various embodiments, the vapor can condense upon the one or more substrates 130. For example, the evaporation source 140 can be an evaporation boat, crucible, filament coil, electron beam evaporation source, or any suitable evaporation source 140. In some embodiments, the evaporation source 140 is disposed in a first subchamber of the vacuum chamber 110. In various embodiments, the vapor of the fourth type evaporation source material can be ionized, for example using an ionization discharger, prior to condensation over the substrate to increase reactivity. In the illustrated embodiment, a first and second sputtering source 135 are disposed on opposing sides of the vacuum chamber and substantially equidistant from evaporation source 140 about the perimeter of the vacuum chamber.

In various embodiments, apparatus 100 includes a first isolation source configured to isolate an evaporation source 140 from a first sputtering source 135. The first isolation source can be configured to prevent fourth type material from evaporation source 140 from contaminating the first sputtering source 135. In the illustrated embodiment, the first isolation source is an isolation pump 152, such as, for example, a vacuum pump. In other embodiments, the apparatus 100 can include a plurality of isolation pumps 152. In various embodiments, the isolation source can include a combination of an isolation pump 152 and an isolation subchamber (not shown).

In some embodiments, the first isolation pump can include a vacuum pump 152 disposed within a first subchamber of the vacuum chamber to maintain the pressure in the first subchamber lower than the pressure in the vacuum chamber outside of the first subchamber. For example, the first isolation pump 152 can be disposed within a first subchamber of the vacuum chamber housing the evaporation source 140 to maintain the pressure in the first subchamber lower than the pressure in the vacuum chamber outside of the first subchamber and to isolate the evaporation source 140 from the first sputtering source. In various embodiments, the isolation source 152 can be an evacuation source 152 such as, for example, a vacuum pump 152 configured to evacuate atoms from the vacuum chamber to prevent contamination of a sputtering source 135. For example, isolation source 152 can be a vacuum pump 152 disposed within a first subchamber of the vacuum chamber housing the evaporation source 140 and configured to evacuate evaporation source material atoms to prevent contamination of a sputtering source 135. In various embodiments, isolation source 152 can be a vacuum pump disposed along a perimeter surface of the vacuum chamber and configured to evacuate atoms (e.g. evaporation source material atoms) from the vacuum chamber to prevent contamination of sputtering source 135.

In embodiments including a plurality of sputtering sources 135 and/or a plurality of evaporation sources 140, apparatus 100 can include a plurality of isolation sources to isolate each of the evaporation sources from each of the sputtering sources 135. For example, in embodiments having first and second sputtering sources 135 disposed on opposing sides of a vacuum chamber and an evaporation source 140 disposed there between on a perimeter surface of the vacuum chamber, apparatus 100 can include a first isolation pump 152 disposed between the first sputtering source 135 and evaporation source 140 and a second isolation pump 152 disposed between the second sputtering source 135 and evaporation source 140. In the illustrated embodiment, apparatus 100 includes an isolation pump 152 disposed between evaporation source 140 and one of the two sputtering sources 135.

The solar cell forming apparatus 100 can include one or more heaters 117 to heat the plurality of substrates 130 disposed on a plurality of surfaces 122 of the rotatable substrate apparatus 120. In the illustrated embodiment, a plurality of heaters are disposed in a heater apparatus 115 to heat the plurality of substrates. As shown in FIG. 1, heater apparatus 115 can have a shape that is substantially conformal with the shape of the substrate apparatus. In the illustrated embodiment, the plurality of heaters 117 are shown positioned in a substantially octagonal shape arrangement within a heating apparatus 115. However, the heater apparatus 115 can have any suitable shape. In various embodiments, the heater apparatus 115 is disposed to maintain a substantially uniform distance about the perimeter of the substrate apparatus 120. In the illustrated embodiment, heater apparatus 115 is disposed about an interior surface of the rotatable substrate apparatus 120. In some embodiments, the heater apparatus 115 can be disposed about an interior surface of a rotatable drum 110. A power source of the heater apparatus 115 can extend through a surface of the rotatable drum 110. In various embodiments, the substrate apparatus 120 is rotatable around the heater apparatus 115. In some embodiments, the heater apparatus 115 is disposed about an exterior surface of a rotatable drum 110. In some embodiments, the heater apparatus 115 can be coupled to a surface of the vacuum chamber. The heater apparatus 115 can be rotatable. In other embodiments, the heater apparatus 115 is configured to not rotate. The one or more heaters 117 can include, but are not limited to, infrared heaters, halogen bulb heaters, resistive heaters, or any suitable heater for heating a substrate 130 during a deposition process. In some embodiments, the heater apparatus 115 can heat a substrate to a temperature between approximately 300 and 550 degrees Celsius (e.g. 295 and 555 degrees Celsius).

As shown in FIG. 1, apparatus 100 can include an isolation baffle 170 disposed about the evaporation source 140. Isolation baffle 170 can be configured to direct a vapor of an evaporation source material to a particular portion of a surface of the plurality of substrates 130. Isolation baffle 170 can be configured to direct a vapor of an evaporation source material away from a sputtering source 135. Apparatus 100 can include an isolation baffle 170 in addition to one or more isolation sources to minimize evaporation source material 122 contamination of one or more sputtering sources 135. The isolation baffle 170 can be composed of a material such as, for example, stainless steel or other similar metals and metal alloys. In some embodiments, the isolation baffle 170 is disposable. In other embodiments, the isolation baffle 170 is cleanable.

In some embodiments, apparatus 100 can include one or more in-situ monitoring devices 160 to monitor process parameters such as temperature, chamber pressure, film thickness, or any suitable process parameter. In various embodiments, apparatus 100, can include a load lock chamber 182 and/or an unload lock chamber 184. In embodiments of the present disclosure, apparatus 100 can include a buffer subchamber 155 (e.g. a buffer layer deposition subchamber) configured in-situ in apparatus 100 with a vacuum break. In some embodiments, a buffer layer deposition subchamber 155 configured in-situ in apparatus 100 with a vacuum break includes a sputtering source (not shown) including one or more sputtering targets (not shown). In various embodiments, apparatus 100 includes a sputtering source (not shown) disposed in a subchamber of the vacuum chamber and configured to deposit a buffer layer over a surface of each one of the plurality of substrates 130 in substrate apparatus 130. In various embodiments, apparatus 100 includes an isolation source to isolate the buffer layer sputtering source from an evaporation source and/or an absorber monolayer sputtering source. The buffer layer material can include, for example, non-toxic ZnS—O or CdS.

The apparatus 100 of FIG. 1 can also be used to form solar cells of different absorber films, for example, a copper-zinc-tin-sulfur-selenium (CZTSS) absorber film. In some embodiments, a number of CZTSS absorber layer are formed in apparatus 100 by further providing tin, copper, zinc, or copper/zinc targets. as targets 137. The evaporation source 140 may use sulfur, selenium or both sulfur and selenium as source material. Additionally, another evaporation source 140 may be used to separately provide selenium and sulfur source material.

Figure 2:
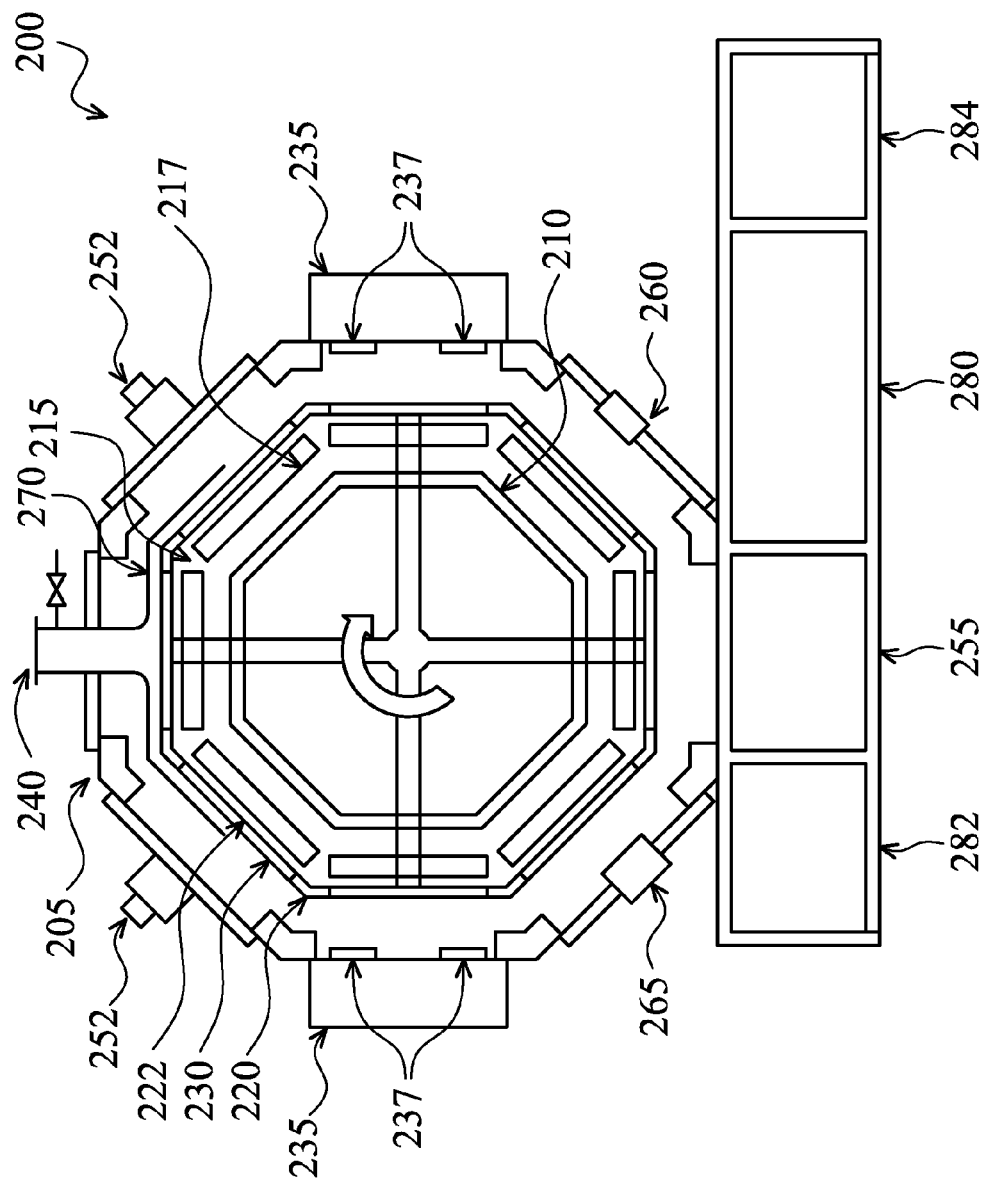
FIG. 2 is a schematic diagram illustrating a top view of an example of a solar cell forming apparatus according to some embodiments.

With reference now to FIG. 2, a schematic diagram illustrating a top view of an example of a CIGS solar cell forming apparatus 200 according to embodiments of the present disclosure is provided. In various embodiments, apparatus 200 can include a housing 205 defining a vacuum chamber, a rotatable substrate apparatus 220 configured to hold a plurality of substrates 230 on a plurality of surfaces 222, a first sputtering source 235 configured to deposit a plurality of absorber layer atoms of a first type over at least a portion of a surface of each of the plurality of substrates 230, an evaporation source 240 configured to deposit a plurality of absorber layer atoms of a second type over at least a portion of the surface of each of the plurality of substrates 230, a first isolation source 252 configured to isolate the evaporation source 240 from the first sputtering source 235, a second sputtering source 235 configured to deposit a plurality of absorber layer atoms of a third type over at least a portion of the surface of each of the plurality of substrates 230, and a second isolation source configured to isolate the evaporation source 240 from the second sputtering source 235.

In the illustrated embodiment, apparatus 200 includes a rotatable drum 210, a heater apparatus 215 including a plurality of heaters 217, an isolation baffle 270, a load lock chamber 282, an unload lock chamber 284, a monitoring device 260, and sputtering targets 237 in each of the first and second sputtering sources 235, as described above for FIG. 2. In various embodiments, apparatus 200 includes a buffer layer deposition source 265. In the illustrated embodiment, buffer layer deposition source 265 is disposed along an interior perimeter surface of housing 205. In some embodiments, buffer layer deposition source 265 can be disposed in a subchamber of the vacuum chamber. In various embodiments, buffer layer sputtering source 265 is configured to deposit a n-type buffer layer, such as for example, a cadmium sulfide (CdS) buffer layer, or a ZnS-O buffer layer, over the absorber layer. The buffer layer can include any suitable buffer layer material.

In the illustrated embodiment, the first and second isolation sources include first and second isolation pumps 252, such as vacuum pumps 252, configured to respectively isolate the first and second sputtering sources 235 from the evaporation source 240. In some embodiments (not shown), one or more of the isolation pumps 252 is configured to maintain the pressure in an evaporator source 240 sub-chamber (not shown) lower than the pressure in the vacuum chamber. The isolation pumps 252 can be configured to evacuate second type absorber layer atoms from evaporation source 240 from the vacuum chamber, prevent diffusion of the second type absorber layer atoms into the sputtering targets 237, and prevent the second type absorber layer atoms from contaminating the two sputtering sources 235. In some embodiments, apparatus 200 can include an loading/unloading substrate chamber 255 and post-treatment chamber 280. In various embodiments, post-treatment chamber 280 can be configured for post treatment of the CIGS cell such as, for example, cooling the CIGS cell.

Figure 3:
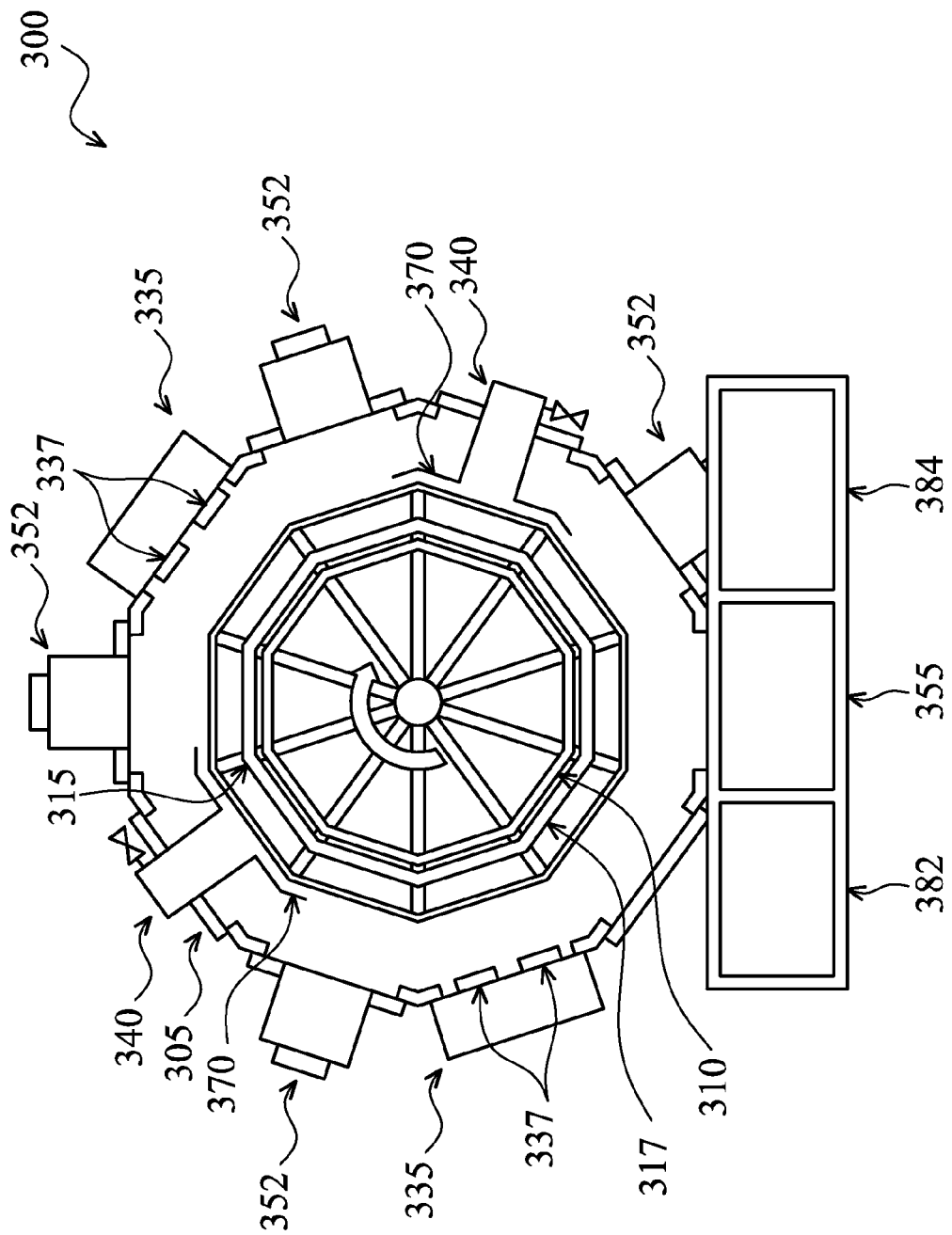
FIG. 3 is a schematic diagram illustrating a top view of an example of a solar cell forming apparatus according to some embodiments.
Figure 4:
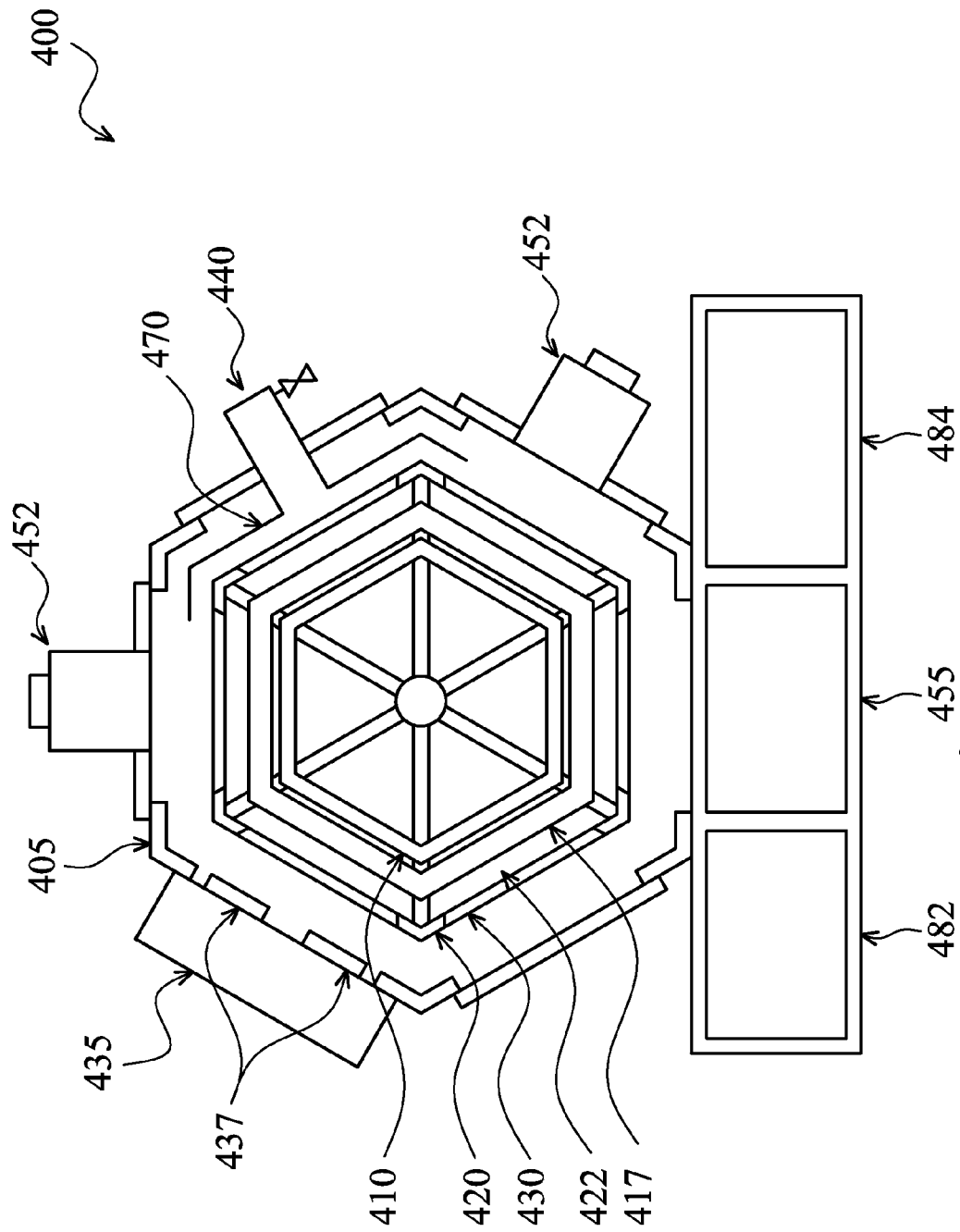
FIG. 4 is a schematic diagram illustrating a top view of an example of a solar cell forming apparatus according to some embodiments.

Referring now to FIG. 3, a schematic diagram illustrating a top view of an example of a solar cell forming apparatus 300 according to embodiments of the present disclosure is provided. In the illustrated embodiment, apparatus 300 includes a housing 305 defining a vacuum chamber, a rotatable drum 310, a heater apparatus 315 including a plurality of heaters 317, a rotatable substrate apparatus holding a plurality of substrates 330, a plurality of sputtering sources 335, a plurality of sputtering targets 337, an evaporation source 340, an isolation baffle 370, a load lock chamber 382, an unload lock chamber 384, and a buffer subchamber 355 as described above for FIGS. 1 and 2. In the illustrated embodiment, the rotatable drum 310, heater apparatus 315, and housing 305 are substantially shaped as a decagon. As shown in FIG. 3, apparatus 300 can include two evaporation sources 340. In the illustrated embodiment, four isolation pumps 352 are provided and configured to isolate evaporation sources 340, sputtering sources 335 and buffer subchamber 355. In various embodiments, isolation pumps 352 are configured to minimize evaporation source type absorber layer atom contamination on the two sputtering sources 335 and in buffer subchamber 355. Referring now to FIG. 4, apparatus 400 includes one sputtering source 435, one evaporation source 440, and buffer subchamber 455. In the illustrated embodiment, two isolation pumps 452 are provided in apparatus 400 and configured to isolate sputtering source 435, evaporation source 440, and buffer subchamber 455, and to minimize evaporation source type absorber layer atom contamination on the sputtering sources 435 and in buffer subchamber 455. In some embodiments, buffer subchamber 455 can be configured for buffer layer deposition such as, for example, by sputtering.

Figure 5:
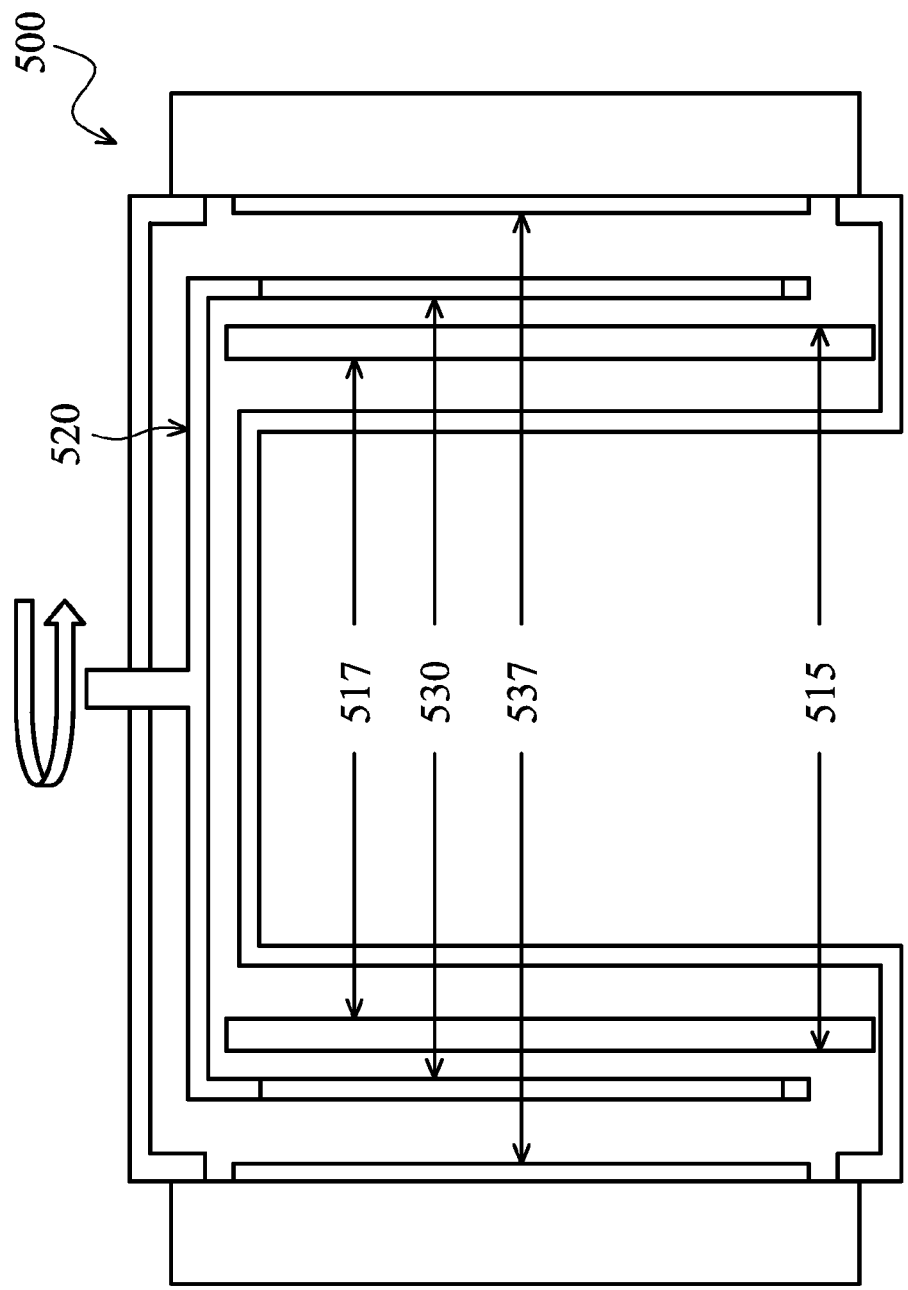
FIG. 5 is a schematic diagram illustrating a side view of an example of a solar cell forming apparatus with a substrate apparatus having a substantially vertical loading surface according to embodiments of the present disclosure.

With reference to FIG. 5, a schematic diagram illustrating a side view of an example of a solar cell forming apparatus 500 with a rotatable substrate apparatus 520 having a substantially vertical loading surface according to embodiments of the present disclosure. In the illustrated embodiment, the rotatable substrate apparatus 520 is configured to hold a plurality of substrates 530 on a plurality of surfaces where each of the plurality of surfaces are substantially vertical and are disposed facing an interior surface of the vacuum chamber. The sputtering source 537 is disposed within the vacuum chamber. In various embodiments, a heater apparatus 515 including a plurality of heaters 517 is provided. As shown, the heater apparatus 515 can be coupled to a bottom surface of the housing 505 such that it is configured not to rotate. In the illustrated embodiment, the plurality of heaters are disposed along an interior surface of the rotatable substrate apparatus 520 and are disposed substantially vertically to substantially conform with the disposition of the plurality of surfaces of the substrate apparatus 520.

Figure 6:
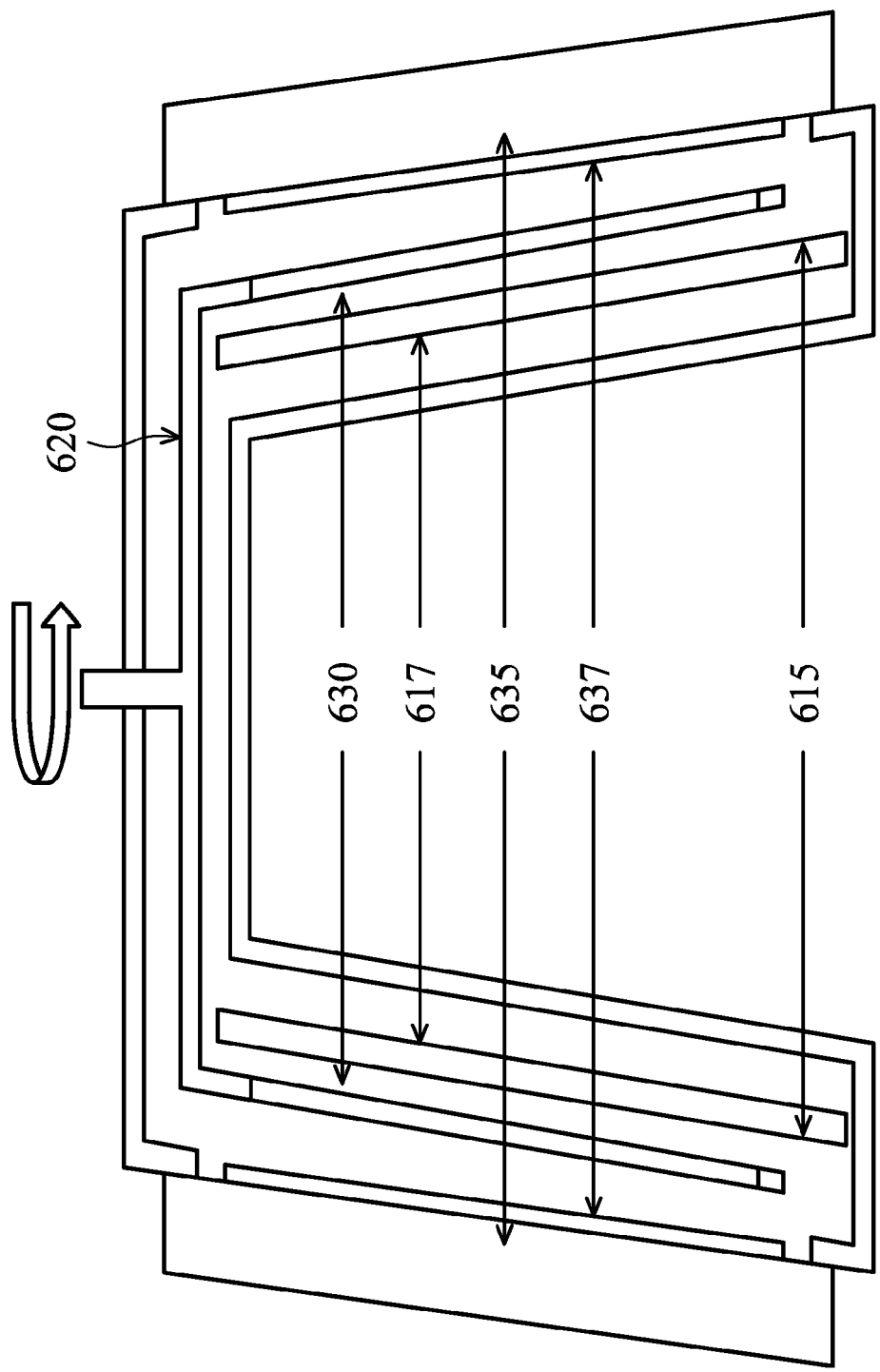
FIG. 6 is a schematic diagram illustrating a side view of an example of a solar cell forming apparatus with a substrate apparatus having a tilted loading surface according to some embodiments.

Referring now to FIG. 6, in other embodiments, the rotatable substrate apparatus 620 can be configured to hold a plurality of substrates 630 on a plurality of surfaces where each of the plurality of surfaces are disposed at a predetermined tilt angle relative to vertical such as, for example, relative to the interior surface of the vacuum chamber. In some embodiments, the predetermined tilt angle is between approximately 1 and 5 degrees of tilt (e.g. 0.8 degrees and 5.2 degrees of tilt). For example, the plurality of surfaces of substrate apparatus 620 can be tilted at a predetermined tilt angle of 2 degrees relative to the interior surface of the vacuum chamber. In another example, the plurality of surfaces of substrate apparatus 620 can be tilted at a predetermined tilt angle of 0.5 degrees relative to the interior surface of the vacuum chamber. In various embodiments, the plurality of heaters 617 in the heater apparatus 615, and/or sputtering targets 637 in sputtering sources 635 can also be tilted at the predetermined tilt angle to substantially conform with the disposition of the plurality of surfaces of the substrate apparatus 620. In other embodiments, the plurality of surfaces of substrate apparatus 620 can be tilted at a predetermined tilt angle while the plurality of heaters 617 in the heater apparatus 615, and/or sputtering targets 637 in sputtering sources 635 remain substantially vertical.

Figure 7:
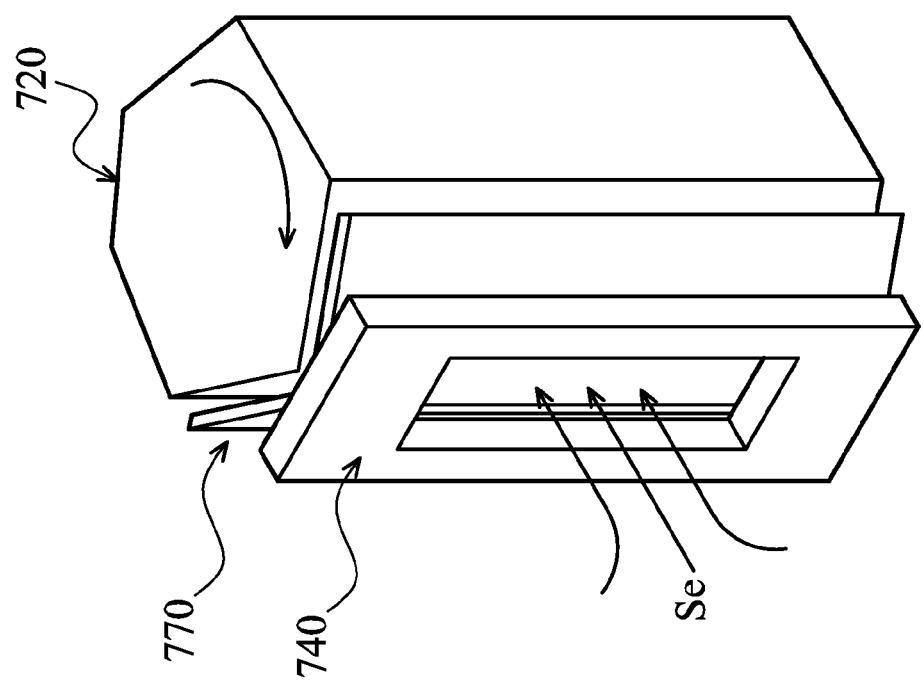
FIG. 7 illustrates a perspective view of an example of an isolation baffle according to embodiments of the present disclosure.

Referring now to FIG. 7, a perspective view of an example of an isolation baffle 770 is provided. In various embodiments, the shape of isolation baffle 770 is configured to substantially conform with the shape of rotatable substrate apparatus 720. In the illustrated embodiment, isolation baffle 770 has a shape that is configured to substantially conform with the octagonal shape of the rotatable substrate apparatus 720. Isolation baffle 770 can extend to an evaporation shield 740, which has a port. The evaporation source (not shown) is disposed to direct a vapor of a material from evaporation source to a particular portion of a surface of the plurality of substrates held in substrate apparatus 720. The evaporation shield 740 can have a port and extended to the isolation baffle 770 is disposed to direct a vapor of a material from an evaporation source (not shown) away from a sputtering source. FIG. 7 illustrates diffusion of a material from an evaporation source (not shown) into a port of evaporation shield 740. As shown, the port can be rectangular in shape. However, the port can be any suitable shape. A slot can be provided in the port and blade of isolation baffle 770 to permit passage of absorber layer atoms from the evaporation source to at least a portion of a surface of each of the substrates held in substrate apparatus 720.

Figure 8:
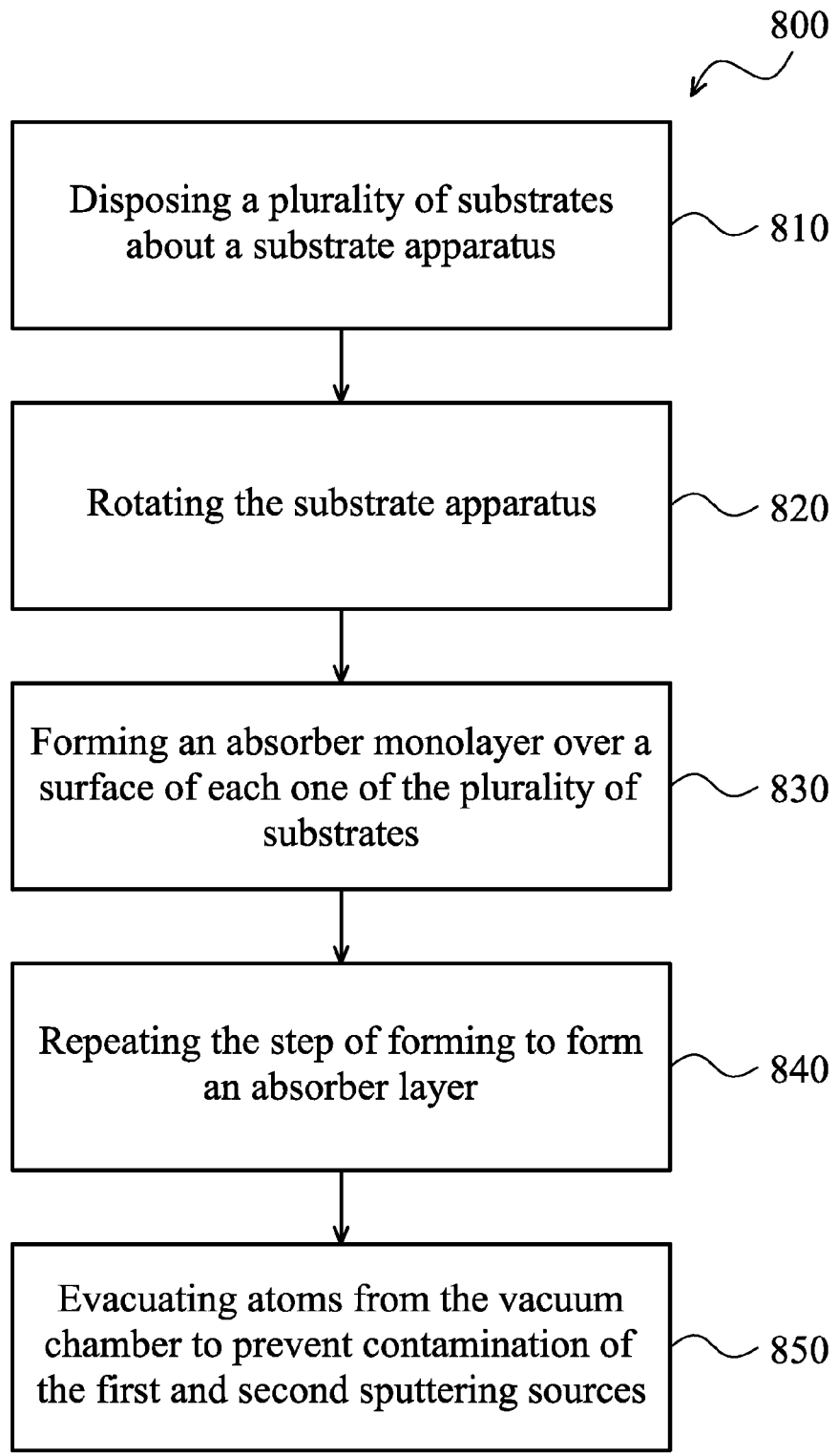
FIG. 8 is a flow chart illustrating a method of forming a solar cell absorber layer on the substrate according to embodiments of the present disclosure.

FIG. 8 is a flow chart illustrating a method 800 of forming a solar cell according to embodiments of the present disclosure. At block 810, a plurality of substrates (e.g. 130) are disposed about a plurality of surfaces (e.g. 122) of a substrate apparatus (e.g. 120) that is operatively coupled to rotate within a vacuum chamber. At block 820, the substrate apparatus 120 is rotated. At block 830, an absorber monolayer is formed over a surface 122 of each one of the plurality of substrates 130.

Figure 9:
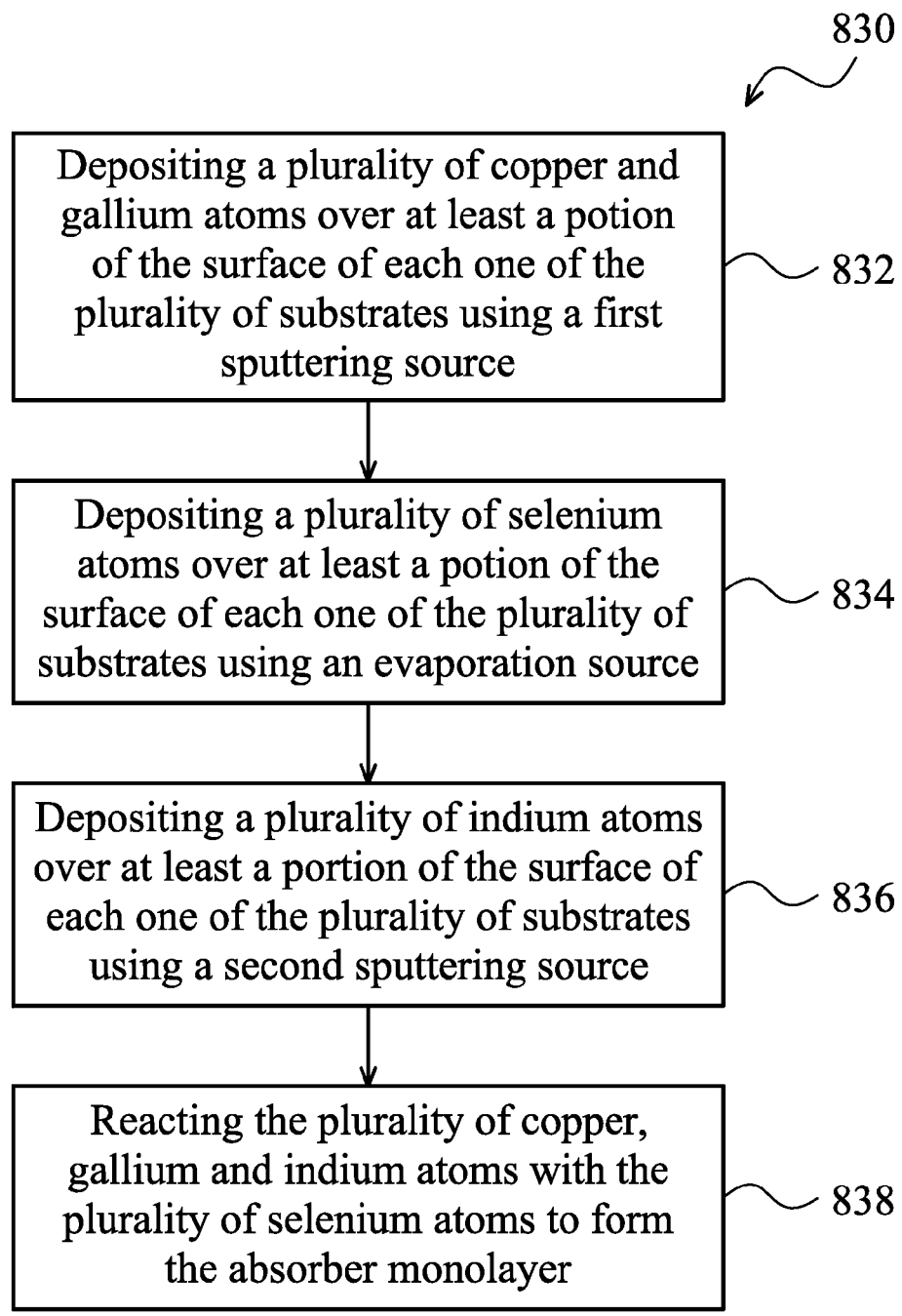
FIG. 9 is a flow chart illustrating a step of forming an absorber monolayer of a method of forming a solar cell according to embodiments of the present disclosure.

Referring now to FIG. 9, a flow chart illustrating details of the step 830 (of FIG. 8) of forming the absorber monolayer of the method 800 of forming a solar cell according to embodiments of the present disclosure is provided. In various embodiments, at block 832, a plurality of copper and gallium atoms are deposited over at least a portion of the surface 122 of each one of the plurality of substrates 130 using a first sputtering source (e.g. 135). At block 834, a plurality of selenium atoms are deposited over at least a portion of the surface 122 of each one of the plurality of substrates 130 using an evaporation source (e.g. 140). At block 836, a plurality of indium atoms are deposited over at least a portion of the surface 122 of each one of the plurality of substrates 130 using a second sputtering source (e.g. 135). At block 838, the plurality of copper, gallium, and indium atoms are reacted with the plurality of selenium atoms to form the absorber monolayer.

Figure 10:
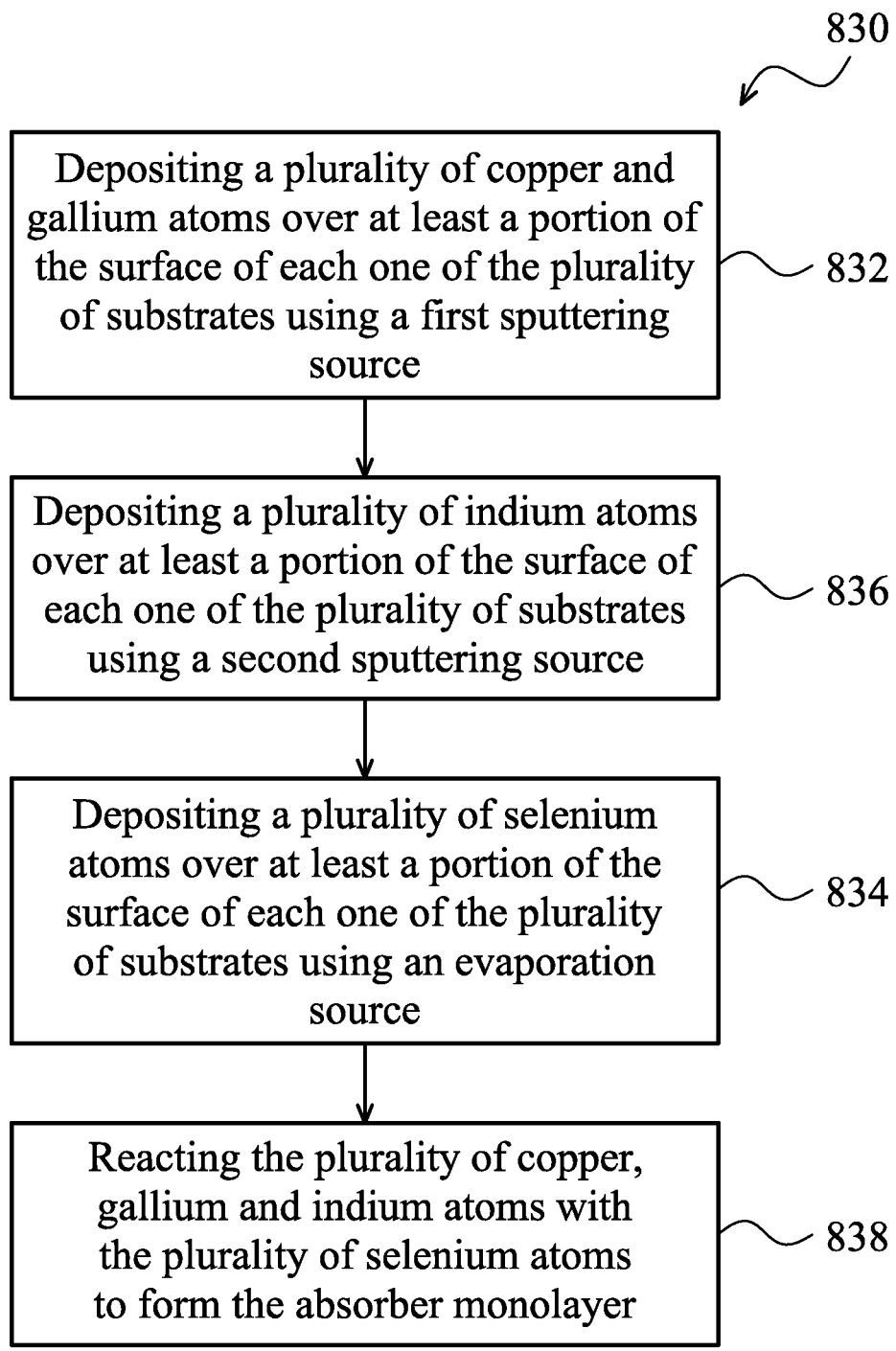
FIG. 10 is a flow chart illustrating a step of forming an absorber monolayer of a method of forming a solar cell according to embodiments of the present disclosure.

With reference to FIG. 10, a flow chart illustrating details of the step 830 (of FIG. 8) of forming the absorber monolayer of the method 800 of forming a solar cell according to some embodiments of the present disclosure is provided. In some embodiments, at block 832, a plurality of copper and gallium atoms are deposited over at least a portion of the surface 122 of each one of the plurality of substrates 130 using a first sputtering source (e.g. 135). At block 834, a plurality of indium atoms are deposited over at least a portion of the surface 122 of each one of the plurality of substrates 130 using a second sputtering source (e.g. 135). At block 836, a plurality of selenium atoms are deposited over at least a portion of the surface 122 of each one of the plurality of substrates 130 using an evaporation source (e.g. 140). At block 838, the plurality of copper, gallium, and indium atoms are reacted with the plurality of selenium atoms to form the absorber monolayer.

Adjusting a power source of a sputtering source (e.g. first and/or second sputtering source 135) can control a sputtering rate and a concentration of the sputtered copper, gallium, and/or indium atoms deposited over the substrate 130. Similarly, adjusting a power source of an evaporation source 140 can control an evaporation rate and a concentration of the evaporated selenium atoms deposited over the substrate 130. The speed and/or direction of rotation of the substrate apparatus 120 also can affect the rate and amount of sputtered copper, gallium, and/or indium atoms and the amount of evaporated selenium atoms deposited over the substrate 130. As described above, selecting the copper-gallium concentration in one or more copper-gallium sputtering targets (e.g. 137) of one or more sputtering sources (e.g. 135) can control concentration of the sputtered copper and gallium atoms to a desired gradient concentration. In various embodiments, one or more of the power source of each sputtering source and each evaporation source, the sputtering rate of each sputtering source, the evaporation rate of each evaporation source is controlled to form a predetermined composition of an absorber monolayer. In various embodiments, the formed absorber monolayer includes a composition of 20 to 24% copper, 4 to 14% gallium, 10 to 24% indium and 49 to 53% selenium. In some embodiments, the composition is 23% copper, 9% gallium, 17% indium, 51% selenium. The inventors have discovered that by using the methods and apparatus of forming the absorber monolayer described herein, an increased efficiency and accuracy for forming the absorber monolayer having the predetermined composition can be achieved.

Referring again to FIG. 8, at block 840, the step of forming the absorber monolayer 930 is repeated to form an absorber layer. In various embodiments, each one of the formed monolayers of the absorber layer include a composition of 20 to 24% copper, 4 to 14% gallium, 10 to 24% indium and 49 to 53% selenium. The inventors have determined that by using the methods and apparatus of forming the absorber monolayer described herein, an increased efficiency and accuracy for forming each one of the absorber monolayers in the absorber layer at the predetermined composition can be achieved. Thus, in various embodiments, each rotation of the substrate apparatus (e.g. 120) results in the deposition of a plurality of atoms of the absorber layer elements to achieve a desired gradient composition. At block 850, a plurality of atoms are evacuated from the vacuum chamber to prevent contamination of the first and second sputtering sources. In various embodiments, a plurality of selenium atoms are evacuated from the vacuum chamber using a first isolation pump (e.g. 252) disposed between the evaporation source 140 and the first sputtering source 135 and a second isolation pump (252) disposed between the evaporation source 140 and the second sputtering source 135. In various embodiments, a buffer layer is deposited over the absorber layer of each one of the plurality of substrates using a third sputtering source (e.g. 135) disposed in a subchamber (e.g. 155) of the vacuum chamber. In other embodiments, the absorber monolayers can comprise elements of other semiconductor compounds, including, but not limited to, ClSe, CGSe, CIS, CGS, CIGSe, CIGSeS, CZTS or any suitable compound to form an absorber layer of a solar cell.

Figure 11A:
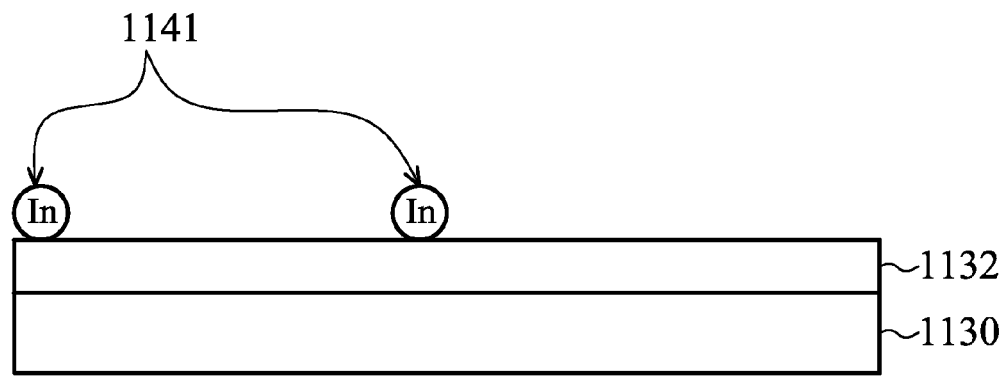
FIGS. 11A, 11B, 11C, 11D, 11E, and 11F illustrate a sectional view of a deposition of an absorber layer over a substrate according to embodiments of the present disclosure.
Figure 11B:
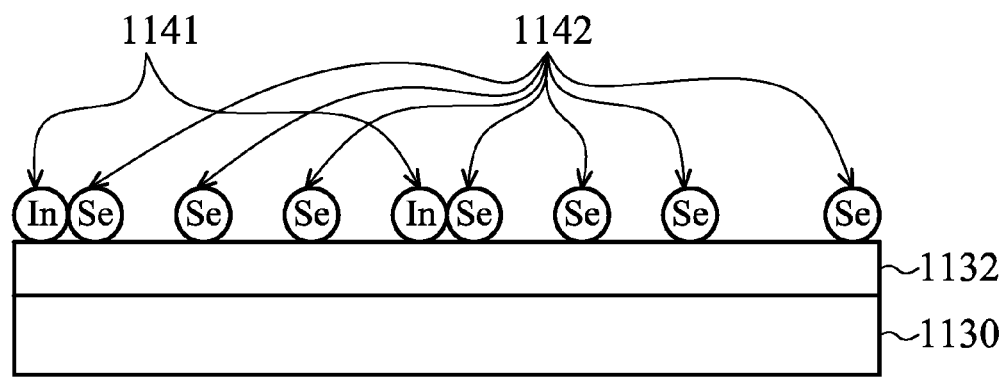
Figure 11C:
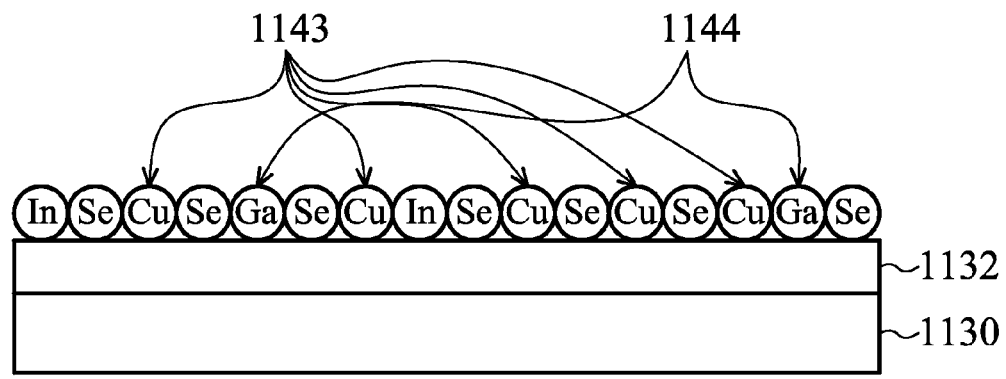

With reference now to FIGS. 11A-F, a sectional view of a deposition of an absorber layer over a substrate is illustrated according to embodiments of the present disclosure. A plurality of absorber layer atoms can be deposited over the substrate 1130 as described and shown in FIGS. 1-10. In the illustrated embodiment, the plurality of absorber layer atoms are shown as being deposited on a bottom electrode layer 1132 deposited on the substrate. Referring now to FIG. 11A, a plurality of first type absorber layer atoms 1141 such as, for example, indium atoms, can be deposited by sputtering such as by a first sputtering source (e.g. 135) to achieve a first concentration of indium atoms. Referring to FIG. 11B, a plurality of second type absorber layer atoms 1042 such as, for example, selenium atoms, can be deposited by evaporating such as by an evaporating source (e.g. 140) to achieve a second concentration of selenium atoms. As shown in FIG. 11C, a plurality of third type absorber layer atoms 1143 such as, for example, copper atoms, or third type 1143 and fourth type 1144 absorber layer atoms, such as, for example, copper and gallium atoms, can be deposited by sputtering such as by a second sputtering source (e.g. 135) to achieve a third concentration or a third concentration and fourth concentration. In various embodiments, the plurality of third type absorber layer atoms 1143 can include sodium doped copper atoms.

Figure 11D:
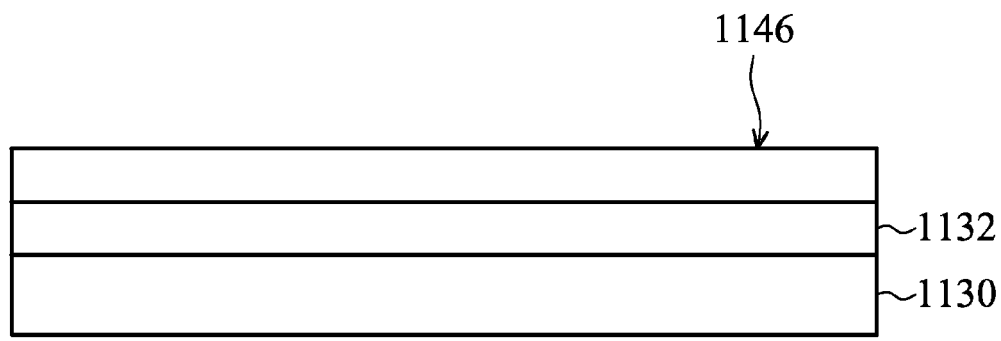

As shown in FIG. 11D, the plurality of absorber layer atoms (1141, 1142, 1143, 1144) can react in a monolayer reaction. In various embodiments, the monolayer reaction can form an absorber monolayer 1146 over the substrate. In various embodiments, the absorber monolayer 1146 is a CIGS monolayer. The monolayer reaction results in better uniformity and a more consistent and desired bandgap in the absorber layer. The inventors have determined that the sequential method of forming the absorber monolayer described herein results in a more accurate and improved process to achieve the desired monolayer composition. In some embodiments, ionizing a plurality of the second absorption components such as, for example, selenium, can increase the reaction rate. As shown in FIGS. 11A-11F, this process forms an absorber layer at a predetermined stoichiometric composition in a more accurate and more efficient manner.

Figure 11E:
Figure 11F:
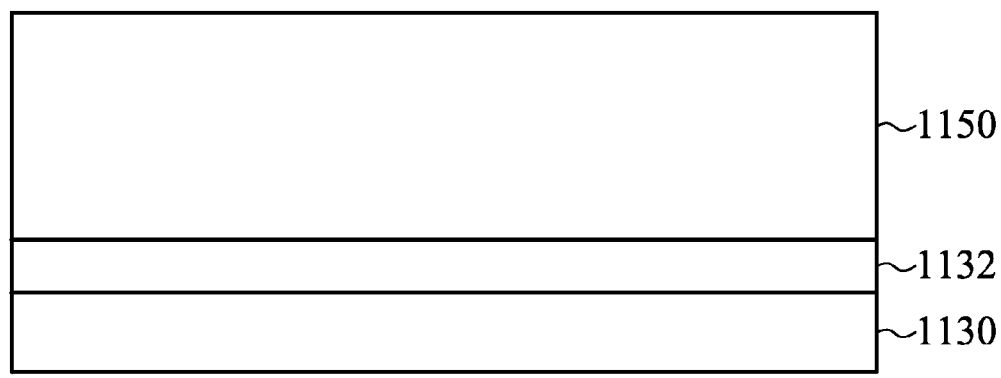

In various embodiments, the formed absorber layer has a graded energy band gap. The absorber layer can be configured to substantially absorb the energy of a plurality of wavelengths of incoming light. In various embodiments, an absorber monolayer (1146, 1147, 1148, etc.) can be approximately 10 Å or 1 nm thick. As shown in FIG. 11E, more of the plurality of absorption components can be deposited over the absorber monolayer 1146 using the same process (11A-11D) to react in another monolayer reaction to form another absorber monolayer. An aggregate of all of the absorber monolayers can form the absorber layer 1150 as shown in FIG. 11F. In various embodiments, the absorber layer 1150 is a polycrystalline CIGS layer. The step of forming the absorber monolayers monolayer (1146, 1147, 1148, etc.) can be repeated until a predetermined thickness of the absorber layer 1150 is achieved. In some embodiments, the predetermined thickness can be approximately 1500 nm (1490-1510 nm.) In other embodiments, the predetermined thickness can be approximately 1200 nm (1190-1210 nm.) In various embodiments, a buffer layer (not shown) can be formed over the absorber layer.

Figure 12:
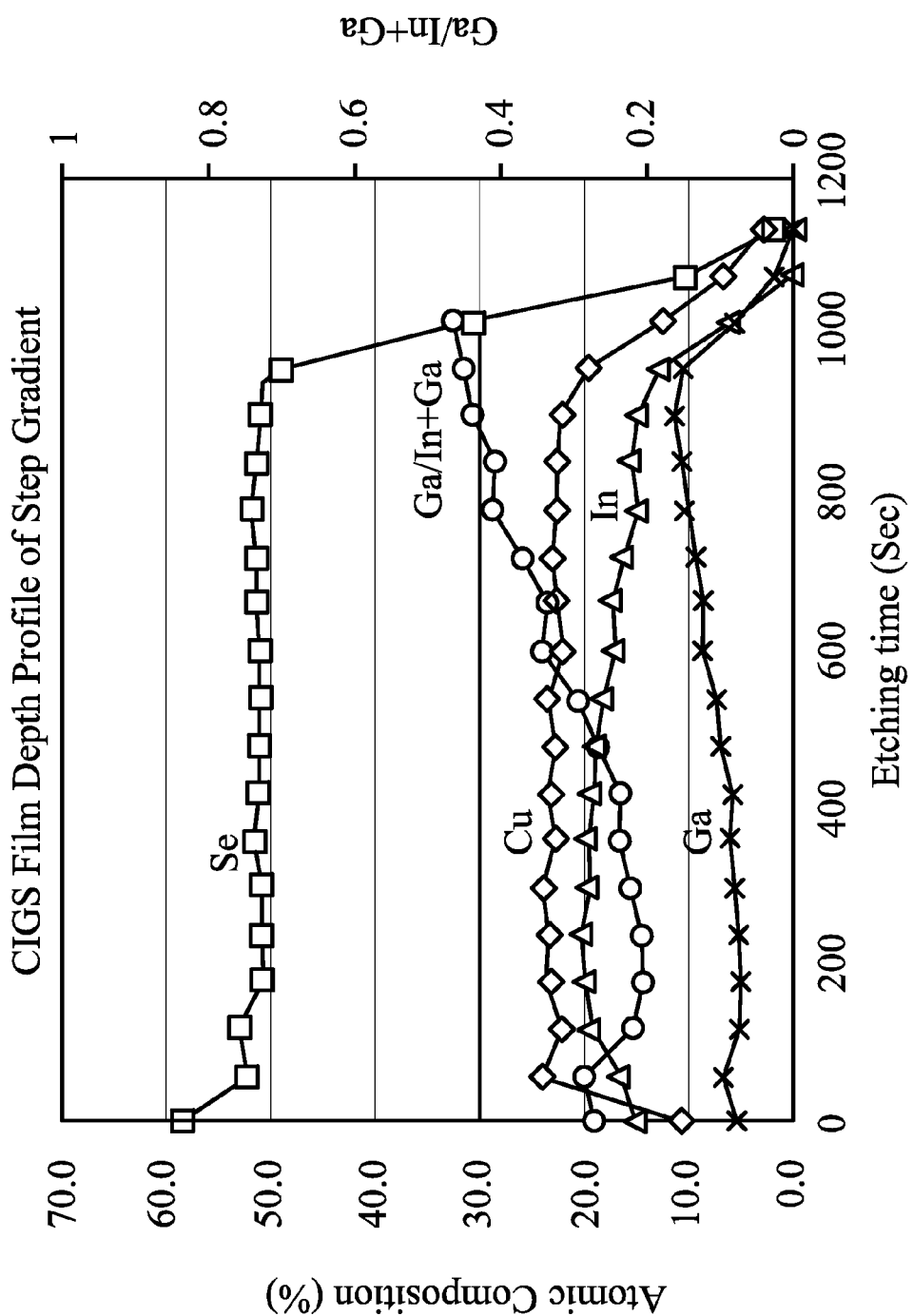
FIG. 12 is a graph illustrating an Auger Electron Spectroscopy (AES) depth profile analysis of an example absorber layer according to embodiments of the present disclosure.

FIG. 12 illustrates a graph of an Auger Electron Spectroscopy (AES) depth profile analysis of an example of an absorber layer formed according to some embodiments. As shown in FIG. 12, the absorber layer has a gradient composition that is substantially consistent across different depths of the absorber layer. An X-axis of the AES depth profile analysis is an etching time in seconds. A left side Y-axis of the AES depth profile analysis is an atomic composition of the plurality of absorber layer elements. As shown in FIG. 12, the atomic composition of copper and selenium remained substantially constant across different depths of the absorber layer. FIG. 12 also shows decreasing amounts of indium, consistent with the increasing amounts of gallium, across different depths of the absorber layer. The right side Y-axis of the AES depth profile analysis is the atomic composition ratio of gallium to indium plus gallium. FIG. 12 shows the atomic composition ratio of gallium to indium plus gallium can be controlled with double gradient throughout the absorber layer.

Throughout the description and drawings, example embodiments are given with reference to specific configurations. It will be appreciated by those of ordinary skill in the art that the present disclosure can be embodied in other specific forms. Those of ordinary skill in the art would be able to practice such other embodiments without undue experimentation. The scope of the present disclosure, for the purpose of the present patent document, is not limited merely to the specific example embodiments or alternatives of the foregoing description.

As shown by the various configurations and embodiments illustrated in FIGS. 1-12 various improved CIGS films have been described.

According to some embodiments, an apparatus for forming a solar cell is provided. The apparatus includes a housing defining a vacuum chamber, a rotatable substrate apparatus configured to hold a plurality of substrates on a plurality of surfaces wherein each of the plurality of surfaces is disposed facing an interior surface of the vacuum chamber, a first sputtering source configured to deposit a plurality of absorber layer atoms of a first type over at least a portion of a surface of each one of the plurality of substrates, an evaporation source disposed in a first subchamber of the vacuum chamber and configured to deposit a plurality of absorber layer atoms of a second type over at least a portion of the surface of each one of the plurality of substrates, and a first isolation source configured to isolate the evaporation source from the first sputtering source.

According to various embodiments, a method of forming a solar cell is provided. The method includes disposing a plurality of substrates about a plurality of surfaces of a substrate apparatus that is operatively coupled to rotate within a vacuum chamber, rotating the substrate apparatus, forming an absorber monolayer over a surface of each one of the plurality of substrates. The step of forming includes depositing a plurality of copper and gallium atoms over at least a portion of the surface of each one of the plurality of substrates using a first sputtering source, depositing a plurality of selenium atoms over at least a portion of the surface using an evaporation source, depositing a plurality of indium atoms over at least a portion of the surface of each one of the plurality of substrates using a second sputtering source, and reacting the plurality of copper, gallium, and indium atoms with the plurality of selenium atoms to form the absorber monolayer. The method also includes repeating the step of forming to form an absorber layer.

According to some embodiments, an apparatus for forming a solar cell is provided. The apparatus includes a housing defining a vacuum chamber, a rotatable substrate apparatus configured to hold a plurality of substrates on a plurality of surfaces wherein each of the plurality of surfaces are disposed facing an interior surface of the vacuum chamber, a first sputtering source configured to deposit a plurality of copper and gallium atoms over at least a portion of the surface of each one of the plurality of substrates, an evaporation source disposed in a first subchamber of the vacuum chamber and configured to deposit a plurality of selenium atoms over at least a portion of the surface of each one of the plurality of substrates, a second sputtering source configured to deposit a plurality of indium atoms over at least a portion of the surface of each one of the plurality of substrates, a third sputtering source disposed in a second subchamber of the vacuum chamber and configured to deposit a buffer layer over the surface of each one of the plurality of substrates, and an evacuation source configured to evacuate atoms from the vacuum chamber to prevent contamination of the first and second sputtering sources.

While various embodiments have been described, it is to be understood that the embodiments described are illustrative only and that the scope of the subject matter is to be accorded a full range of equivalents, many variations and modifications naturally occurring to those of skill in the art from a perusal hereof.

Furthermore, the above examples are illustrative only and are not intended to limit the scope of the disclosure as defined by the appended claims. Various modifications and variations can be made in the methods of the present subject matter without departing from the spirit and scope of the disclosure. Thus, it is intended that the claims cover the variations and modifications that can be made by those of ordinary skill in the art.

What we claim is:

1. An apparatus for forming a solar cell, comprising:
a housing defining a vacuum chamber;
a rotatable substrate apparatus configured to hold a plurality of substrates on a plurality of surfaces wherein each of the plurality of surfaces is disposed facing an interior surface of the vacuum chamber;
a first sputtering source configured to deposit a plurality of absorber layer atoms of a first type over at least a portion of a surface of each one of the plurality of substrates;
an evaporation source disposed in a first subchamber of the vacuum chamber and configured to deposit a plurality of absorber layer atoms of a second type over at least a portion of the surface of each one of the plurality of substrates; and
a first isolation source configured to isolate the evaporation source from the first sputtering source.

2. The apparatus of claim 1, wherein the first isolation source comprises one or more of an isolation pump.

3. The apparatus of claim 2, wherein the first isolation source comprises:
a vacuum pump disposed within the first subchamber to maintain the pressure in the first subchamber lower than the pressure in the vacuum chamber outside of the first subchamber.

4. The apparatus of claim 1, further comprising:
a heater apparatus configured to heat the plurality of substrates, wherein the substrate apparatus is polygonally-shaped, and wherein the heater apparatus has a shape that is substantially conformal with the shape of the substrate apparatus.

5. The apparatus of claim 1, further comprising:
a second sputtering source configured to deposit a plurality of absorber layer atoms of a third type over at least a portion of the surface of each one of the plurality of substrates.

6. The apparatus of claim 5, wherein the first and second sputtering sources are disposed adjacent to each other within the vacuum chamber.

7. The apparatus of claim 5, wherein the first and second sputtering sources are disposed on opposing sides of the vacuum chamber.

8. The apparatus of claim 7, further comprising:
an isolation baffle disposed about the evaporation source.

9. The apparatus of claim 8, further comprising:
a first isolation pump disposed between the evaporation source and the second sputtering source; and wherein the first isolation source comprises a second isolation pump disposed between the evaporation source and the first sputtering source.

10. The apparatus of claim 5, further comprising:
a third sputtering source disposed in a second subchamber of the vacuum chamber and configured to deposit a buffer layer over the surface of each one of the plurality of substrates;
a second isolation source configured to isolate the evaporation source from the second sputtering source; and
a third isolation source configured to isolate the evaporation source from the third sputtering source.

11. The apparatus of claim 5, wherein the first type comprises copper, the second type comprises selenium and the third type comprises indium.

12. The apparatus of claim 11, wherein the first sputtering source is configured to deposit a plurality of absorber layer atoms of a first type and a fourth type over at least a portion of the surface of each one of the plurality of substrates, and wherein the fourth type is gallium.

13. The apparatus of claim 1, further comprising a monitoring device to monitor a process parameter in the vacuum chamber.

14. The apparatus of claim 1, further comprising a rotatable drum disposed within the vacuum chamber and coupled to a first surface of the vacuum chamber, the rotatable drum having a shape that is substantially conformal with the shape of the substrate apparatus.

15. The apparatus of claim 1, wherein each of the plurality of surfaces of the substrate apparatus are disposed at a predetermined tilt angle relative to the interior surface of the vacuum chamber.

16. A method of forming a solar cell, comprising:
disposing a plurality of substrates about a plurality of surfaces of a substrate apparatus that is operatively coupled to rotate within a vacuum chamber;
rotating the substrate apparatus;
forming an absorber monolayer over a surface of each one of the plurality of substrates, the step of forming comprising:
depositing a plurality of copper and gallium atoms over at least a portion of the surface of each one of the plurality of substrates using a first sputtering source;
depositing a plurality of selenium atoms over at least a portion of the surface using an evaporation source;
depositing a plurality of indium atoms over at least a portion of the surface of each one of the plurality of substrates using a second sputtering source; and
reacting the plurality of copper, gallium, and indium atoms with the plurality of selenium atoms to form the absorber monolayer; and
repeating the step of forming to form an absorber layer.

17. The method of claim 16, further comprising a step of evacuating atoms from the vacuum chamber to prevent contamination of the first and second sputtering sources, wherein the evacuating comprises:
evacuating a plurality of selenium atoms from the vacuum chamber using a first isolation pump disposed between the evaporation source and the first sputtering source and a second isolation pump disposed between the evaporation source and the second sputtering source.

18. The method of claim 16, further comprising:
depositing a buffer layer over the absorber layer of each one of the plurality of substrates using a third sputtering source disposed in a subchamber of the vacuum chamber.

19. The method of claim 16, wherein each one of the formed monolayers of the absorber layer comprises a composition of 20 to 24% copper, 4 to 14% gallium, 10 to 24% indium and 49 to 53% selenium.

20. An apparatus for forming a solar cell, comprising:
a housing defining a vacuum chamber;
a rotatable substrate apparatus configured to hold a plurality of substrates on a plurality of surfaces wherein each of the plurality of surfaces are disposed facing an interior surface of the vacuum chamber;
a first sputtering source configured to deposit a plurality of copper and gallium atoms over at least a portion of the surface of each one of the plurality of substrates;
an evaporation source disposed in a first subchamber of the vacuum chamber and configured to deposit a plurality of selenium atoms over at least a portion of the surface of each one of the plurality of substrates;
a second sputtering source configured to deposit a plurality of indium atoms over at least a portion of the surface of each one of the plurality of substrates;
a third sputtering source disposed in a second subchamber of the vacuum chamber and configured to deposit a buffer layer over the surface of each one of the plurality of substrates; and
an evacuation source configured to evacuate atoms from the vacuum chamber to prevent contamination of the first and second sputtering sources.

* * * * *